(12) United States Patent
Concilio

(10) Patent No.: US 7,861,016 B2
(45) Date of Patent: Dec. 28, 2010

(54) TRANSACTION STACK FOR ELECTRONIC DEVICES INCLUDING NON VOLATILE MEMORY WITH LIMITED AMOUNT OF WRITING CYCLE

(75) Inventor: Mariano Concilio, Scafati (IT)

(73) Assignee: Incard S.A., Geneva (CH)

( * ) Notice: Subject to any disclaimer, the term of this patent is extended or adjusted under 35 U.S.C. 154(b) by 242 days.

(21) Appl. No.: 11/912,945

(22) PCT Filed: Apr. 28, 2006

(86) PCT No.: PCT/EP2006/003981

§ 371 (c)(1),
(2), (4) Date: Oct. 29, 2007

(87) PCT Pub. No.: WO2006/117146

PCT Pub. Date: Nov. 9, 2006

(65) Prior Publication Data

US 2008/0195773 A1 Aug. 14, 2008

(30) Foreign Application Priority Data

Apr. 29, 2005 (EP) .................................. 05425277

(51) Int. Cl.
*G06F 3/00* (2006.01)
(52) U.S. Cl. .......................................... 710/52; 710/53
(58) Field of Classification Search ........................ None
See application file for complete search history.

(56) References Cited

U.S. PATENT DOCUMENTS

| | | | | | |
|---|---|---|---|---|---|
| 5,003,471 | A | * | 3/1991 | Gibson ........................ | 710/56 |
| 7,325,082 | B1 | * | 1/2008 | Schibinger et al. .......... | 710/111 |
| 2005/0055498 | A1 | | 3/2005 | Beckert et al. .............. | 711/104 |

FOREIGN PATENT DOCUMENTS

EP 0964360 12/1999

OTHER PUBLICATIONS

Endoh et al., "A New Write/Erase Method to Improve the Read Disturb Characteristics Based on the Decay Phenomena of Stress Leakage Current for Flash Memories," Jan. 1998, IEEE, pp. 1-7.*
Stress H, "*Unauffaellige Breuckenbauer*", Elektronik, Weka Fachzeitschriftenverlag, Poing, De, vol. 43, No. 22, Oct. 31, 1994, pp. 146-150, XPOO0474171.

* cited by examiner

*Primary Examiner*—Eron J Sorrell
(74) *Attorney, Agent, or Firm*—Lisa K. Jorgenson; Allen, Dyer, Doppelt, Milbrath & Gilchrist, P.A.

(57) ABSTRACT

A transaction stack for devices with a limited writing cycle memory slides in a transaction buffer. Following any Commit Transaction or, alternatively, any Begin Transaction, the transaction stack is reallocated inside the transaction buffer. Consequently, some memory locations in the transaction buffer are released. The writing accesses to the non-volatile area memory of the transaction buffer are not concentrated in the first address, as in a standard implementation of a transaction stack, but they are spread over the locations of the transaction buffer.

22 Claims, 5 Drawing Sheets

Initial state
10

BeginTransaction
10

SecureUpdate("567", A1, L1)
10

*SecureUpdate("89", A2, L2)*

10

| A1 | L1 | 0 | 1 | 2 | A2 | L2 | 3 | 4 | |

↑Top

20

| A1 | L1 | 0 | 1 | 2 | A2 | L2 | 3 | 4 | |

| 5 | 6 | 7 | 8 | 9 |

30      ↑Top

*CommitTransaction*

10

20

| 5 | 6 | 7 | 8 | 9 |

↑Top
40

Initial state

A1      A2

| ? | ? | ? | 3 | 4 |

├── L1 ──┼── L2 ──┤

| A1 | L1 | 0 | 1 | 2 | | | | |

↑Top

Fig. 3a (Prior Art)

*RollbackTransaction*

| 0 | 1 | 2 | 3 | 4 |

↑Top

Fig. 3b (Prior Art)

| Slot #1 | #2 | #3 | #4 | #5 |
|---|---|---|---|---|
| 1 | 0 Top | 1 | 1 | 1 |

| | | | | |
|---|---|---|---|---|
| 1 | 0 Top | 1 New Top | 1 | 1 |

| | | | | |
|---|---|---|---|---|
| 1 | 0 Top | 0 New Top | 1 | 1 |

| | | | | |
|---|---|---|---|---|
| 1 | 1 | 0 New Top | 1 | 1 |

Fig. 4

(Prior Art)

TRANSACTION STACK FOR ELECTRONIC DEVICES INCLUDING NON VOLATILE MEMORY WITH LIMITED AMOUNT OF WRITING CYCLE

FIELD OF THE INVENTION

The present invention relates to a transaction stack for electronic devices including non-volatile memory with limited writing cycles. In particular, the electronic devices store non-volatile data during secure transactions.

BACKGROUND OF THE INVENTION

An embedded device like an IC card uses a portion of a solid-state semiconductor memory to store non-volatile data. The category of non-volatile data includes application executables, files, passwords, cryptographic keys, certificates, user profiles, as well as operating system status variables, application status variables, the application registry, and so on. The content of all the above data is variable during the operating phase of the device, but their values are preserved during power off.

On the contrary, the volatile data is lost during a power off phase and is initialized at the device start-up. The category of volatile data includes the CPU stack, buffers for I/O operations, buffers for temporary computations, and so on.

The non-volatile memory assures that the non-volatile data is not lost following a regular switch-off of the device, i.e., when the electrical deactivation occurs in an idle state of the device. This is the typical case when the deactivation is driven by the logic of the terminal that the device is connected to.

If an accidental electrical deactivation occurs during an application execution, specifically during an updating operation of complex non-volatile data, it is possible that the value of data is left in an inconsistent state. This could completely or partially compromise the functioning or the security of the device in the successive power-on sessions.

To address this problem, operating systems provide a known mechanism of transaction. The transaction mechanism provides to the application layer the instruments to group together an arbitrary number of writing operations, establishing that they have to be considered as a single writing operation with respect to events like a power off. The application has to mark all the writing operations between two instructions. In other words, all the write operations are to be included between two instructions, namely Begin Transaction and Commit Transaction, as schematically shown in FIG. 1.

In case of power off during the execution of the code included between the two instructions Begin Transaction and Commit Transaction, the operating system assures that the values of all the non-volatile data affected by the Secure Updates are restored, at the next device start-up, to the value they had before the statement Begin Transaction. Advanced implementations allow multilevel transactions, with nested levels of Begin Transaction and Commit Transaction instructions.

The transaction mechanism can be implemented by using a transaction stack, as will be clear by the following description and as supported by FIGS. 2a-2e. In these figures, the possible states of execution of a transaction, comprising two Secure Operations, are indicated with reference number 10. In particular, in FIG. 2a the transaction is in an Initial state, in FIG. 2b the transaction is in a Begin Transaction state, in FIG. 2c the transaction is in a Secure Update state, in FIG. 2d the transaction is still in the Secure Update state and, finally, in FIG. 2e the transaction is in a Commit Transaction state.

In FIGS. 2a-2e, the non-volatile memory is also schematically shown and indicated with reference number 20. Values during all the possible states of transaction execution are indicated inside the cells of the non-volatile memory 20. In particular, the start address of the non-volatile memory 20 in which data will be written by the first secure operation is indicated with A1, and the length of data to be written during the first secure operation is indicated with L1.

Similarly, the start address of the non-volatile memory 20 in which data will be written by the second secure operation is indicated with A2, and the length of data to be written during the second secure operation is indicated with L2. The transaction stack is indicated with 30, and the top pointer to the transaction stack is indicated with 40.

The transaction stack 30 is cleaned at the start of Begin Transaction when the transaction is in the Initial state. Each Secure Updating operation, as shown in FIGS. 2c and 2d, adds a record on the transaction stack 30. This contains the information to recover the original value of that data after a potential unexpected power off (typically the data address/size/value). At the start of Commit Transaction the transaction stack 30 is cleaned again.

FIGS. 3a-3b show the recovery, at the device start-up, of the original data values in case of device power off during the first Secure Update operation. In particular, FIG. 3a schematically shows the device start-up after an incorrect power off that caused some data in the non-volatile memory 20 to be lost, with the lost data being indicated with the symbols "???." In FIG. 3b a Rollback transaction restores the lost data inside their original position by recovering the right values from the transaction stack 30.

FIG. 5 instead gives an example of the transaction stack 30 usage for the case of eight consecutive transactions containing a different number of Secure Updating operations. The transactions indicated with numbers 1, 3, 5, 6, 7 and 8 contain just one update, the transaction number 2 contains 2 updates and the transaction number 4 contains 3 updates. FIG. 6 displays a graph showing the total number of writing operations following the eight transactions schematically shown in FIG. 5.

If the device deactivation is regular, there is no application execution ongoing. Then at the device start-up the transaction stack 30 is always empty. If the device is deactivated while an application is working and the execution flow is between the two instructions Begin Transaction and Commit Transaction, then the operating system, at the next start-up, finds the transaction stack 30 not empty and carries out all the recovery operations according the records on the transaction stack 30. After that, the stack is clean.

Implementation of the transaction stack 30 needs a non-volatile variable to store the pointer to the top of the transaction stack 30 (Top in the following). The value of Top is itself sensitive data with respect to an accidental power-off event. So, a dedicated mechanism, independent from the transaction stack, is required to assure the atomicity of the Top variable. This is typically obtained by a dedicated pointerless circular buffer. This approach is feasible because the Top variable is a single, short and predefined-size data (2 or 4 bytes). FIG. 4 shows an example of an atomic updating mechanism for the Top pointer by way of a 5-slot pointerless circular buffer. Each slot is tagged with a binary flag (0 or 1). In each time slot, the current value of Top is contained in the first slot tagged with 0, from left to right.

The non-volatile memory 20 allows a limited number of writing accesses. Over this limit, the data retention time of the non-volatile memory 20 decreases to values not acceptable for any applicable purpose. For example, the number of the allowed writing operations for EEPROM or Flash memories is typically in the range of 100,000 to 1,000,000, independently for each memory cell.

This limitation has a large impact on the standard implementation of the transaction mechanism, as any secure writing operation performed by the applications has the side effect of a further writing operation in the transaction stack 30. More particularly, the first secure writing operation of any transaction (the instructions Secure Update 1 in FIG. 5) causes a writing access to the first byte of the transaction stack 30. The maximum number of writing accesses to this byte bounds the number of the secure updating operations allowed to the applications, irrespective of where the applications write. Even if the device is guaranteed for 100,000 writing operations on each single byte of the non-volatile memory 20, the applications cannot perform more than 100,000 secure updatings, even on different non-volatile memory areas. This is because in opposite cases, the first bytes of the transaction stack 30 could be damaged.

An approach to this limitation could be an implementation of the transactions stack 30 in a circular buffer, where all the bytes are stressed in the same way. Nevertheless, a circular implementation is much more difficult compared to a linear one because of the nature of the transaction mechanism. Each transaction includes one or more records, with different lengths, and nested in case of nested transactions. Moreover, the reuse of the implementation of a linear stack for a circular stack is rather hard.

SUMMARY OF THE INVENTION

In view of the foregoing background, an object of the present invention is to provide an electronic device comprising a non-volatile memory having a transaction stack that is able to stress more than the first bytes during the writing operations on the transaction stack.

This and other objects, advantages and features in accordance with the present invention are provided by a transaction stack of the type in which all the bytes belonging to the transaction buffer are used as long as possible.

In particular, a method may be provided as previously indicated in which the transaction stack is sliding dynamically within a transaction buffer. The transaction stack may have a size less than the size of the transaction buffer.

BRIEF DESCRIPTION OF THE DRAWINGS

FIGS. 2a, 2b, 2c, 2d, 2e are schematic representations of the execution of transaction operations respectively in an Initial state, a Begin Transaction state, a Secure Update state, a Secure Update state, and a Commit Transaction state, according to the prior art.

FIGS. 3a and 3b are schematic representations of a rollback of non-volatile data original values, respectively in an Initial state and a Rollback transaction state, according to the prior art.

FIG. 4 is a schematic representation of an atomic update of the Top pointer by a pointerless buffer, according to the prior art.

DETAILED DESCRIPTION OF THE PREFERRED EMBODIMENTS

Figure 1:
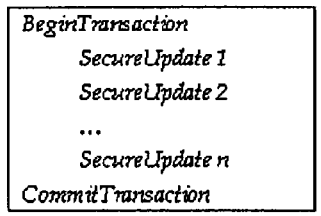
FIG. 1 describes in a high level language execution of Secure operations based on a Begin Transaction and Commit Transaction method, according to the prior art.
Figure 2A:
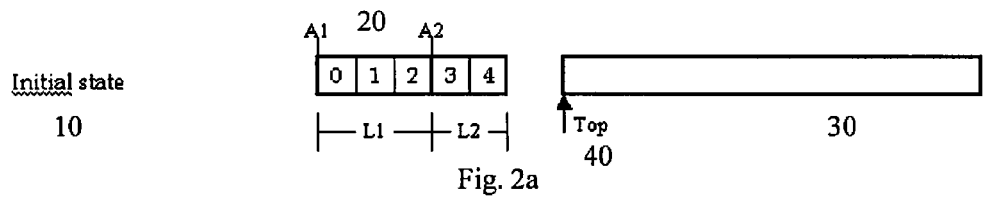
Figure 2B:
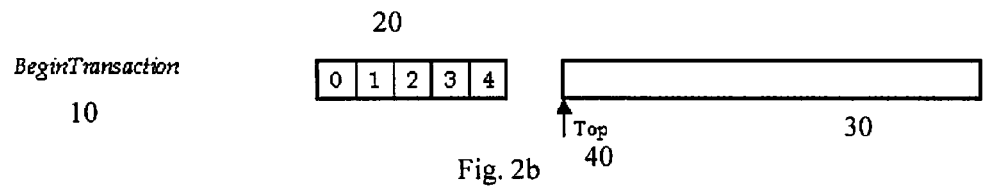
Figure 2C:
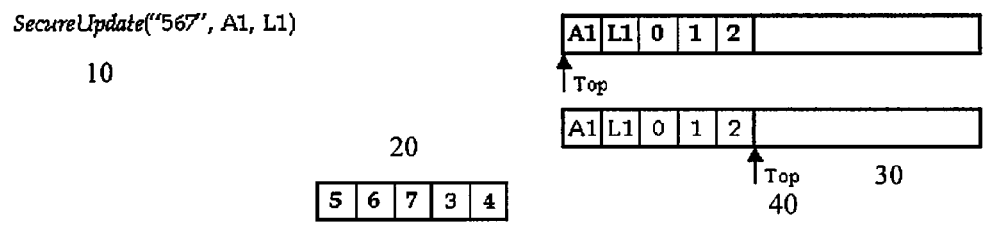
Figure 5:
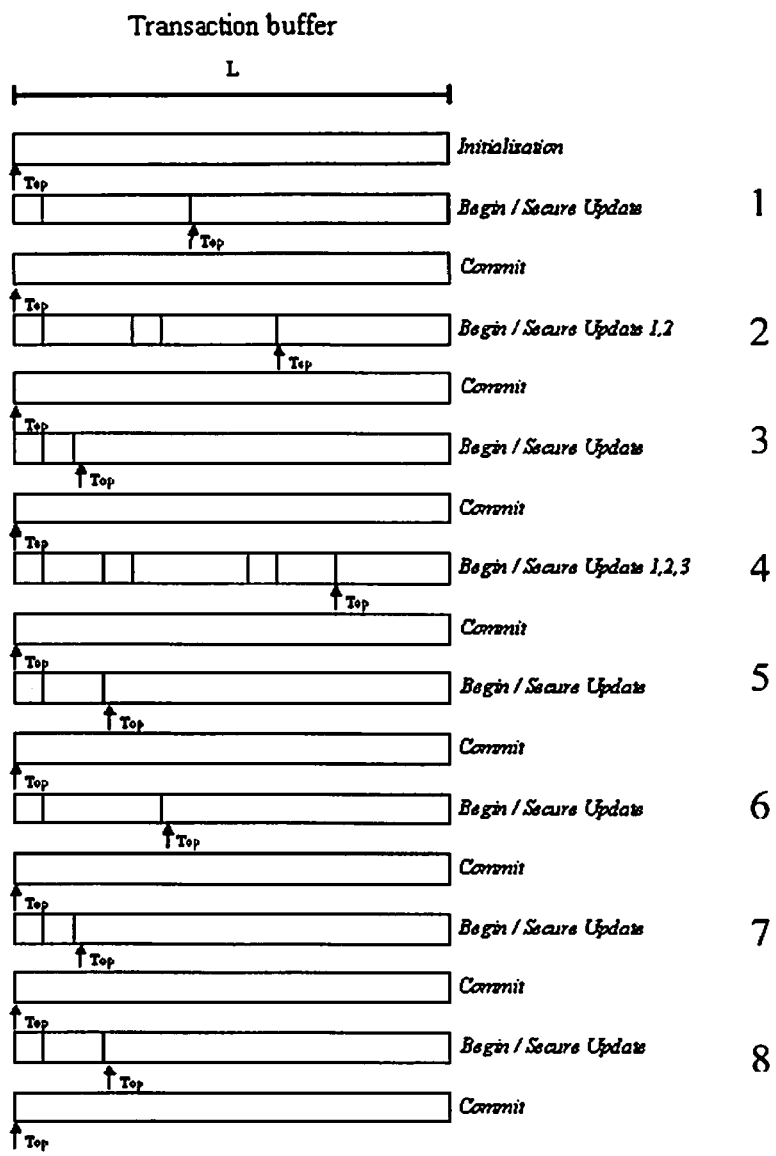
FIG. 5 is a schematic representation of several transactions of secure operations, according to a standard implementation of the prior art.
Figure 6:
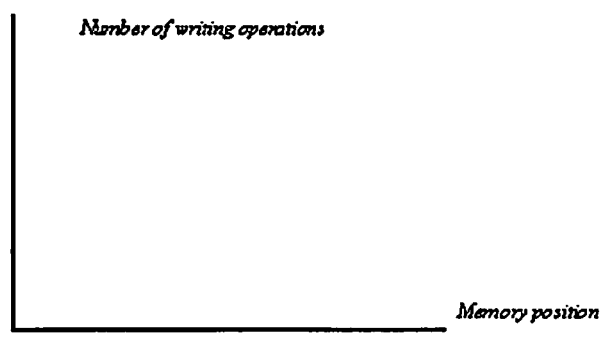
FIG. 6 is a diagram representing the writing operations along the transaction stack, according to transactions of FIG. 5 and the prior art.
Figure 7:
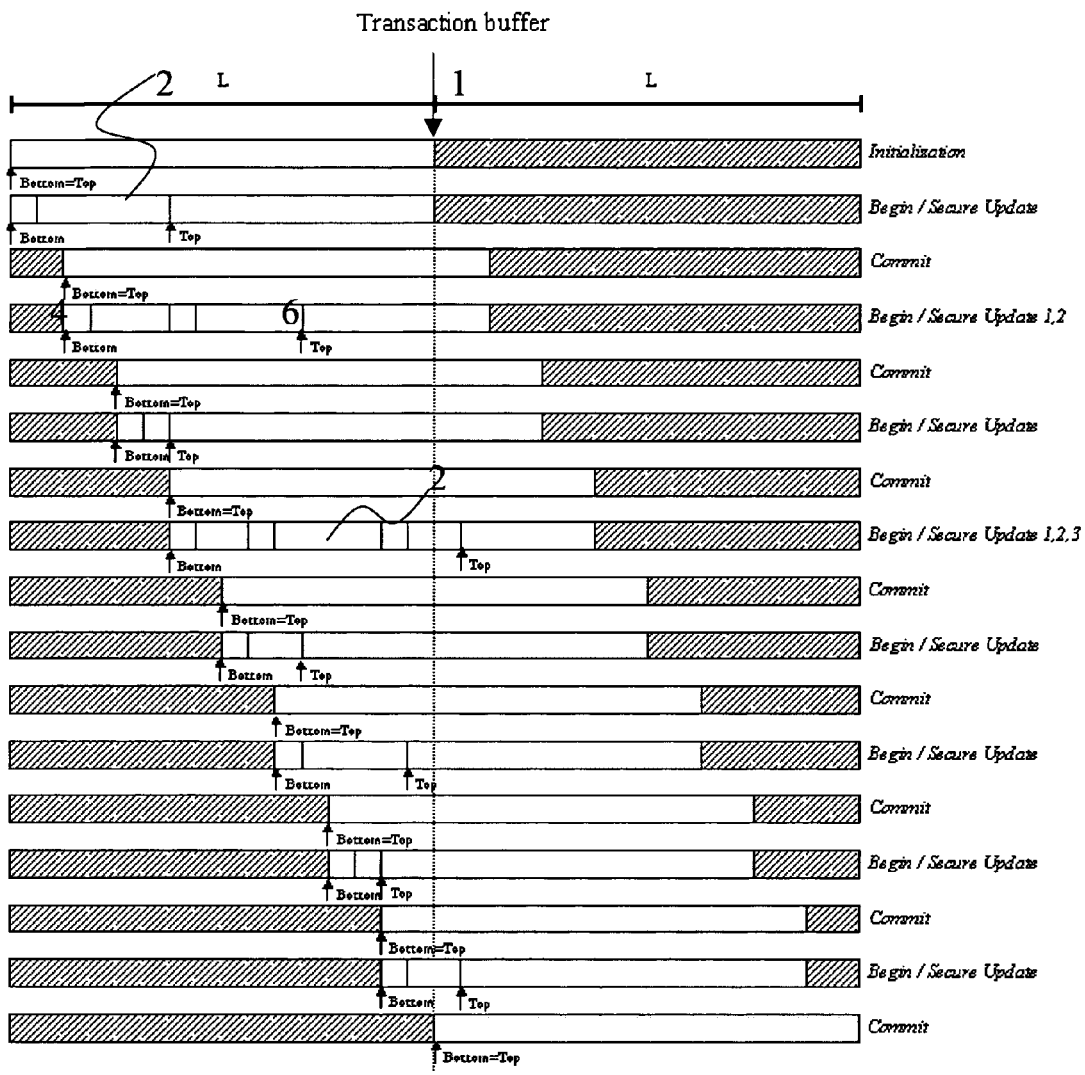
FIG. 7 is a schematic representation of several transactions of secure operations, according to the present invention.

Referring now to FIG. 7, a transaction buffer is globally and schematically shown as indicated by reference number 1. In the same figure a transaction stack is indicated by reference number 2. The technical problem is addressed by a method as previously in which that the transaction stack 2 is sliding dynamically within the transaction buffer 1. This sliding effect is obtained by resetting the start address bottom 4 of the transaction stack 2 to a new position inside the transaction buffer 1, after the execution of the secure transaction.

The bottom pointer 4 moves along the transaction buffer 1 after a beginning transaction of the secure transaction. This is done by resetting its address in a predetermined location included between the start address of the transaction buffer 1 and the location obtained by adding, to the start address, the difference between the lengths of the transaction buffer 1 and the transaction stack 2.

The bottom pointer 4 is set in a specific position during the initialization phase of the device 5, according to a predetermined location rule.

Alternatively, the bottom pointer 4 moves along the transaction buffer 1 after a beginning transaction of the secure transaction. This is done by resetting its address in a random location between the start address of the transaction buffer 1 and the location obtained by adding, to the start address, the difference between the lengths of the transaction buffer 1 and the transaction stack 2.

The transaction stack 2 moves cyclically along the transaction buffer 1 by setting the bottom pointer 4 in different positions along the transaction buffer 1 after each beginning transaction, and by re-setting the bottom pointer 4 at the beginning of the transaction buffer 1 cyclically.

In FIG. 7, the start position of the transaction stack 2 inside the transaction buffer 1 is indicated by a bottom pointer 4. The bottom pointer 4 is set, during a start up phase of the device, at the start of transaction buffer 1 so that the remaining part of transaction buffer 1 is not used for a writing operation.

In other words, if we indicate the start position of transaction buffer 1 with the coordinate 0 and the end position with the coordinate 2L, we can refer to the starting and end positions of the transaction buffer 2 with coordinates 0 and L, respectively.

When a secure update occurs, the transaction stack 2 is written to store values of non-volatile memory to be updated. In particular, the first memory cells of transaction stack 2 are written. In other words, the cells in absolute position with coordinates 0, 1, 2, 3, 4, 5, 6 are written.

After the execution of the first secure update, the bottom pointer 4 shifts, for example, two memory cells through the transaction buffer 1 so that the start and end position of the transaction stack 2 changes respectively in 2 and L+2. In other words, the transaction stack 2 moves into the new free memory cells in the transaction buffer 1. The cells are in absolute position with coordinates from 2 to L+2.

When a second secure update occurs, the transaction stack 2 is once more written to store values of the non-volatile memory to be updated. The first memory cells of transaction stack 2, this time, start from an absolute position with coordinate 2. In other words, the cells in absolute position with coordinates 2, 3, 4, 5, 6, 7, 8, 9, 10, 11 are written and cells with absolute positions 0 and 1 are no longer stressed during this second secure update.

The allocation of the transaction stack 2 is obtained moving the bottom pointer 4 within the dedicated non-volatile memory of the transaction buffer 1. The transaction stack 2 is re-allocated in a new position of the transaction buffer 1 following any Commit Transaction event or, alternatively, a Begin Transaction event.

More particularly, different convenient modes can be implemented. A first embodiment may be based on an initialization phase of the device, like an IC-card as shown above, comprising setting of the transaction stack 2 at the beginning of the transaction buffer 1.

Following the initialization phase, the operative phase and a Commit Transaction event occur. After that, the bottom pointer 4 is moved forward resetting its address in a new location included between the start address of the transaction buffer 1 and a predetermined address, Max_addr. In particular, the address Max_addr is obtained by adding, to the start address of the transaction buffer 1, the difference between the lengths of the transaction buffer 1 and the transaction stack 2. When the bottom pointer 4 reaches the end of the transaction buffer 1, it is driven back to the beginning of the transaction buffer 1.

In another embodiment, an initialization phase of the IC-Card is always present. This phase includes setting of the position of the bottom pointer 4 in some position within the transaction buffer 1, predefined or randomly generated and included between the start address of the transaction buffer 1 and Max_addr. An operative phase follows and, finally, the transaction stack 2 can be re-allocated in a new position following a Begin Transaction event instead of a Commit Transaction event.

The new offset of the transaction stack 2 can follow a predefined law (linear or non-linear) that is a function of the previous offset. The new offset of the transaction stack 2 can be randomly generated according to a predefined distribution law (uniform or non-uniform), that is a function of the position along the transaction buffer 1.

Figure 8:
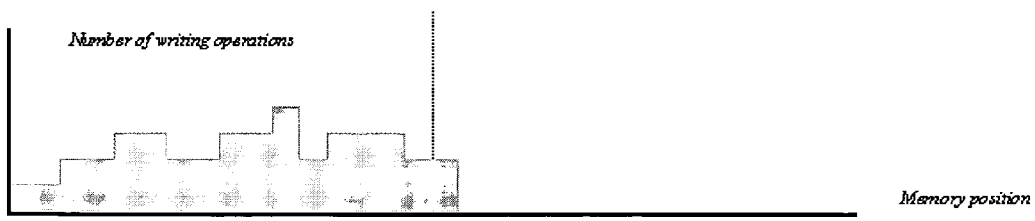
FIG. 8 is a diagram representing the writing operations along the transaction buffer, according to the transactions of FIG. 7.

As explained, FIG. 7 shows a first embodiment with a transaction stack 2 within a transaction buffer 1, initially set at the beginning of the transaction buffer 1. The graph in FIG. 8 gives the distribution on the writing accesses along the transaction buffer 1 according to the example of FIG. 7.

The implementation of a transaction stack 2 contained in a transaction buffer 1 requires the management of two pointers. One is a pointer Top 6 indicating the address of the first free location in the transaction stack 2 for writing operations. The other is a pointer Bottom 4 indicating the start address of the transaction stack 2 in the transaction buffer 1 wherein the transaction stack 2 will be relocated after a Commit Transaction Event. Both of these data are sensitive with respect to a power-off event, and they should be stored in a dedicated pointerless circular buffer, as the pointer Top 6 of the standard implementation.

During the execution of a single transaction, the behavior of the proposed transaction mechanism is the same as the standard implementation. This is both in terms of logic (algorithms/data structures to store the records) and in terms of efficiency (speed and number of updating operations). The difference is that the base address of the process is not fixed, but it is the address pointed by the Bottom pointer 4. This allows a simple and extensive reuse of the standard implementation, with very limited and reliable upgrades.

In case of a Commit Transaction event, the effort required to locate the new position for the transaction stack 2 is just the updating of the Bottom pointer 4 and Top pointer 6 pair to the new address. This effort is comparable with the effort to reset the Top pointer 6 in the standard implementation. The shifting of the transaction stack in the new position is very effective because the transaction stack is moved while it is empty, so no extensive data copying is required.

The advantages of the proposed mechanism with respect to the standard implementation are noticeable. The writing accesses to the non-volatile memory of the transaction buffer 1 are not concentrated in first bytes, but they are spread over a large address range. The address range is defined by the values of the Bottom pointer 4, as illustrated by the graph of FIG. 8.

The implementation is based on a linear and dynamic transaction stack. This allows an easy and extensive reuse of the standard implementation that is based on fixed and linear transaction stacks, which are considerably easier to use with respect to circular stack approaches.

That which is claimed:

1. A method for implementing a linear transaction stack in an electronic device comprising a non-volatile memory with a limited writing cycle and defining a transaction buffer, the method comprising:
   storing non-volatile data during a secure transaction, with the linear transaction stack dynamically sliding within the transaction buffer so as to reduce stress of a first byte of the linear transaction stack, the linear transaction stack having a size less than a size of the transaction buffer.

2. The method according to claim 1, wherein a start address bottom pointer of the linear transaction stack is reset to a new position within the transaction buffer after execution of the secure transaction.

3. The method according to claim 2, wherein the start address bottom pointer moves along the transaction buffer after a beginning transaction of the secure transaction by resetting its address in a specific location between the following based on a location rule:
   a start address of the transaction buffer; and
   a location obtained by adding, to the start address, a difference between a length of the transaction buffer and the linear transaction stack.

4. The method according to claim 2, wherein the start address bottom pointer moves along the transaction buffer after a beginning transaction of the secure transaction by resetting its address in a random location between the following:
   a start address of the transaction buffer; and
   a location obtained by adding, to the start address, a difference between a length of the transaction buffer and the linear transaction stack.

5. The method according to claim 2, wherein the linear transaction stack moves cyclically along the transaction buffer by setting the start address bottom pointer in different positions along the transaction buffer after each beginning transaction, and by re-setting the start address bottom pointer at a beginning of the transaction buffer cyclically.

6. The method according to claim 1, wherein a start address bottom pointer of the linear transaction stack is set at a beginning of the transaction buffer during an initialization phase of the electronic device.

7. The method according to claim 6, wherein the start address bottom pointer is set in a specific position during the initialization phase of the electronic device based on a location rule.

8. A method for implementing a linear transaction stack in an electronic device comprising a non-volatile memory with a limited writing cycle and defining a transaction buffer, the method comprising:
 storing non-volatile data during a secure transaction, with the linear transaction stack dynamically sliding within the transaction buffer so as to reduce stress of a first byte of the linear transaction stack, with a start address bottom pointer of the linear transaction stack being set at a beginning of the transaction buffer during an initialization phase of the electronic device.

9. The method according to claim 8, wherein the linear transaction stack has a size less than a size of the transaction buffer.

10. The method according to claim 8, wherein the start address bottom pointer moves along the transaction buffer after a beginning transaction of the secure transaction by resetting its address in a specific location between the following based on a location rule:
 a start address of the transaction buffer; and
 a location obtained by adding, to the start address, a difference between a length of the transaction buffer and the linear transaction stack.

11. The method according to claim 8, wherein the start address bottom pointer moves along the transaction buffer after a beginning transaction of the secure transaction by resetting its address in a random location between the following:
 a start address of the transaction buffer; and
 a location obtained by adding, to the start address, a difference between a length of the transaction buffer and the linear transaction stack.

12. The method according to claim 8, wherein the linear transaction stack moves cyclically along the transaction buffer by setting the start address bottom pointer in different positions along the transaction buffer after each beginning transaction, and by re-setting the start address bottom pointer at a beginning of the transaction buffer cyclically.

13. A method for implementing a linear transaction stack in an electronic device comprising a non-volatile memory with a limited writing cycle and defining a transaction buffer, the method comprising:
 storing non-volatile data during a secure transaction, with the linear transaction stack dynamically sliding within the transaction buffer so as to reduce stress of a first byte of the linear transaction stack, with a start address bottom pointer of the linear transaction stack being set at a specific position during an initialization phase of the electronic device based on a location rule.

14. The method according to claim 13, wherein the linear transaction stack has a size less than a size of the transaction buffer.

15. The method according to claim 13, wherein the start address bottom pointer is set in a specific position during the initialization phase of the electronic device based on a location rule.

16. An electronic device comprising:
 a non-volatile memory with a limited writing cycle and defining a transaction buffer with non-volatile data being stored therein during secure transactions; and
 said transaction buffer comprising a linear transaction stack dynamically sliding therein so as to reduce stress of a first byte of the linear transaction stack, with said linear transaction stack having a size less than a size of said transaction buffer.

17. The electronic device according to claim 16, wherein a start address bottom pointer of said linear transaction stack is reset to a new position within said transaction buffer after execution of the secure transaction.

18. The electronic device according to claim 17, wherein the start address bottom pointer moves along said transaction buffer after a beginning transaction of the secure transaction by resetting its address in a specific location included between the following based on a location rule:
 a start address of said transaction buffer; and
 a location obtained by adding, to the start address, a difference between a length of the transaction buffer and the linear transaction stack.

19. The electronic device according to claim 17, wherein the start address bottom pointer moves along said transaction buffer after a beginning transaction of the secure transaction by resetting its address in a random location between the following:
 a start address of the transaction buffer; and
 a location obtained by adding, to the start address, a difference between a length of said transaction buffer and said linear transaction stack.

20. The electronic device according to claim 17, wherein said linear transaction stack moves cyclically along said transaction buffer by setting the start address bottom pointer in different positions along said transaction buffer after each beginning transaction, and by re-setting the start address bottom pointer at a beginning of said transaction buffer cyclically.

21. The electronic device according to claim 16, wherein a start address bottom pointer of said linear transaction stack is set at a beginning of said transaction buffer during an initialization phase.

22. The electronic device according to claim 21, wherein the start address bottom pointer is set in a specific position during the initialization phase based on a location rule.

* * * * *